United States Patent
Burke

(10) Patent No.: US 10,236,246 B2
(45) Date of Patent: Mar. 19, 2019

(54) SEMICONDUCTOR DEVICES AND METHODS FOR FORMING A SEMICONDUCTOR DEVICE

(71) Applicant: Infineon Technologies Americas Corp., El Segundo, CA (US)

(72) Inventor: Hugo Burke, Cardiff (GB)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/650,245

(22) Filed: Jul. 14, 2017

(65) Prior Publication Data

US 2018/0019204 A1   Jan. 18, 2018

(30) Foreign Application Priority Data

Jul. 14, 2016   (DE) .................. 10 2016 113 020

(51) Int. Cl.
| | |
|---|---|
| *H01L 23/544* | (2006.01) |
| *H01L 23/522* | (2006.01) |
| *H01L 23/31* | (2006.01) |
| *H01L 23/00* | (2006.01) |
| *H01L 29/76* | (2006.01) |
| *H01L 23/532* | (2006.01) |

(52) U.S. Cl.
CPC ...... *H01L 23/5222* (2013.01); *H01L 23/3171* (2013.01); *H01L 23/5226* (2013.01); *H01L 23/5329* (2013.01); *H01L 23/562* (2013.01); *H01L 29/76* (2013.01); *H01L 23/53295* (2013.01)

(58) Field of Classification Search
CPC ............ H01L 23/5222; H01L 23/3171; H01L 23/5226; H01L 23/562; H01L 29/76
USPC ........................................................ 257/620
See application file for complete search history.

(56) References Cited

U.S. PATENT DOCUMENTS

| | | | |
|---|---|---|---|
| 7,223,673 B2 | 5/2007 | Wang et al. | |
| 2014/0077383 A1 | 3/2014 | Daubenspeck et al. | |
| 2014/0319600 A1 | 10/2014 | Kothandaraman et al. | |
| 2015/0056751 A1* | 2/2015 | Zhang ..................... | H01L 21/78 438/113 |
| 2016/0181208 A1* | 6/2016 | Bao ........................ | H01L 23/562 257/774 |

* cited by examiner

*Primary Examiner* — Tu-Tu V Ho
(74) *Attorney, Agent, or Firm* — Murphy, Bilak & Homiller, PLLC

(57) ABSTRACT

A semiconductor device includes a crack propagation prevention structure. The crack propagation prevention structure is located at an edge region of a wiring layer stack located on a semiconductor substrate of the semiconductor device. Furthermore, the crack propagation prevention structure laterally surrounds at least one wiring structure located within the wiring layer stack. Additionally, the semiconductor device includes an insulation trench extending into the semiconductor substrate. The insulation trench comprises at least an insulation layer electrically insulating the crack propagation prevention structure from the semiconductor substrate. The crack propagation prevention structure extends vertically at least from a surface of the wiring layer stack to the insulation trench.

18 Claims, 3 Drawing Sheets

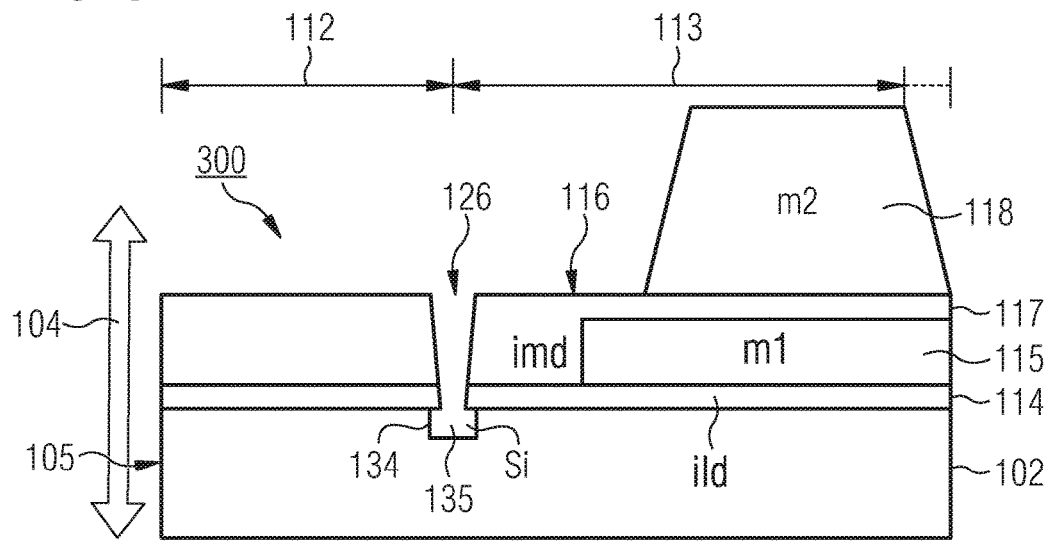
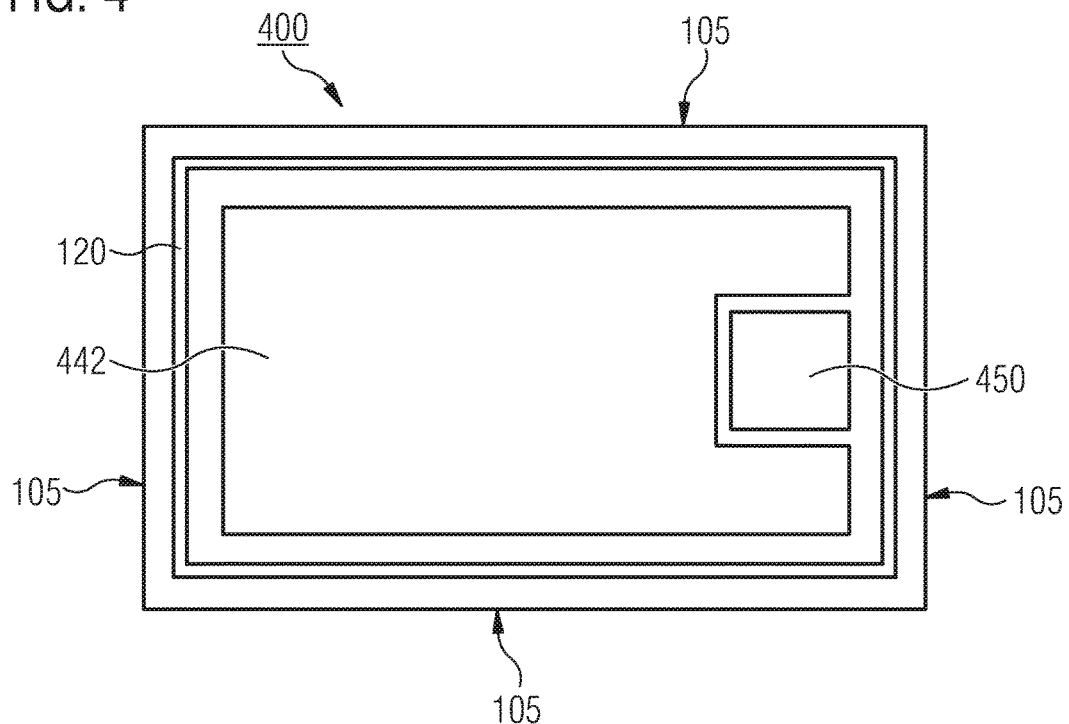

SEMICONDUCTOR DEVICES AND METHODS FOR FORMING A SEMICONDUCTOR DEVICE

CROSS-REFERENCE TO RELATED APPLICATIONS

This application claims priority to German Patent Application No. 102016113020.6 filed Jul. 14, 2016 which is herein incorporated by reference.

TECHNICAL FIELD

Embodiments relate to concepts for crack propagation prevention structures in semiconductor devices and in particular to semiconductor devices and methods for forming semiconductor devices.

BACKGROUND

During the singulation process of semiconductor devices located on a common wafer into individual dies, cracks may be initiated at saw streets and may propagate further into the semiconductor dies. Often these cracks may occur at inter-metal dielectrics and inter-layer dielectrics of a semiconductor die, which are frequently made from brittle materials. Hence, crack propagation prevention is desired for stopping cracks from propagating further into the semiconductor die.

SUMMARY

There may be a demand to provide an improved concept for crack propagation prevention structures in semiconductor devices, which may provide a higher reliability of semiconductor devices and/or a higher yield during manufacturing and/or a longer lifetime of semiconductor devices.

Such a demand may be satisfied by the subject matter of the claims.

Some embodiments relate to a semiconductor device comprising a crack propagation prevention structure. The crack propagation prevention structure is located at an edge region of a wiring layer stack located on a semiconductor substrate of the semiconductor device. Furthermore, the crack propagation prevention structure laterally surrounds at least one wiring structure located within the wiring layer stack. Additionally, the semiconductor device comprises an insulation trench extending into the semiconductor substrate. The insulation trench comprises at least an insulation layer electrically insulating the crack propagation prevention structure from the semiconductor substrate. The crack propagation prevention structure extends vertically at least from a surface of the wiring layer stack to the insulation trench.

Some embodiments relate to another semiconductor device comprising a crack propagation prevention structure. The crack propagation prevention structure is located at an edge region of a wiring layer stack located on a semiconductor substrate of the semiconductor device. Moreover, the crack propagation prevention structure laterally surrounds at least one wiring structure located within the wiring layer stack. The crack propagation prevention structure is an electrically conductive structure and is configured to float during operating the semiconductor device. In addition, the crack propagation prevention structure extends vertically at least from a surface of the wiring layer stack to a vertical distance from the semiconductor substrate equal to or less than a thickness of a gate oxide of a transistor structure of the semiconductor device.

Some embodiments relate to a method for forming a semiconductor device. The method comprises forming an insulation trench extending from a front side surface of a semiconductor substrate of the semiconductor device into the semiconductor substrate. The insulation trench comprises at least an insulation layer. Furthermore, the method comprises forming a crack propagation prevention structure located at an edge region of a wiring layer stack. The wiring layer stack is located on the front side surface of the semiconductor substrate. The crack propagation prevention structure laterally surrounds at least one wiring structure located within the wiring layer stack. Moreover, the crack propagation prevention structure extends vertically at least from the surface of the wiring layer stack to the insulation trench. The insulation layer of the insulation trench electrically insulates the crack propagation prevention structure from the semiconductor substrate.

Some embodiments relate to another method for forming a semiconductor device. The method comprises forming an insulation layer on a front side surface of a semiconductor substrate of the semiconductor device at least at an edge region of the semiconductor substrate. The insulation layer comprises a thickness equal to or less than a thickness of a gate oxide of a transistor structure of the semiconductor device. Additionally, the method comprises forming a crack propagation prevention structure located at an edge region of a wiring layer stack. The wiring layer stack is located on the semiconductor substrate of the semiconductor device. The crack propagation prevention structure laterally surrounds at least one wiring structure located within the wiring layer stack. Moreover, the crack propagation prevention structure is an electrically conductive structure configured to float during operating the semiconductor device. The crack propagation prevention structure extends vertically at least from a surface of the wiring layer stack to the insulation layer formed on the front side surface of the semiconductor substrate.

BRIEF DESCRIPTION OF THE FIGURES

Some embodiments of apparatuses and/or methods will be described in the following by way of example only, and with reference to the accompanying figures, in which

FIG. 3 shows a schematic cross section of a portion of another semiconductor device;

FIG. 4 shows a schematic top view of a semiconductor device;

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
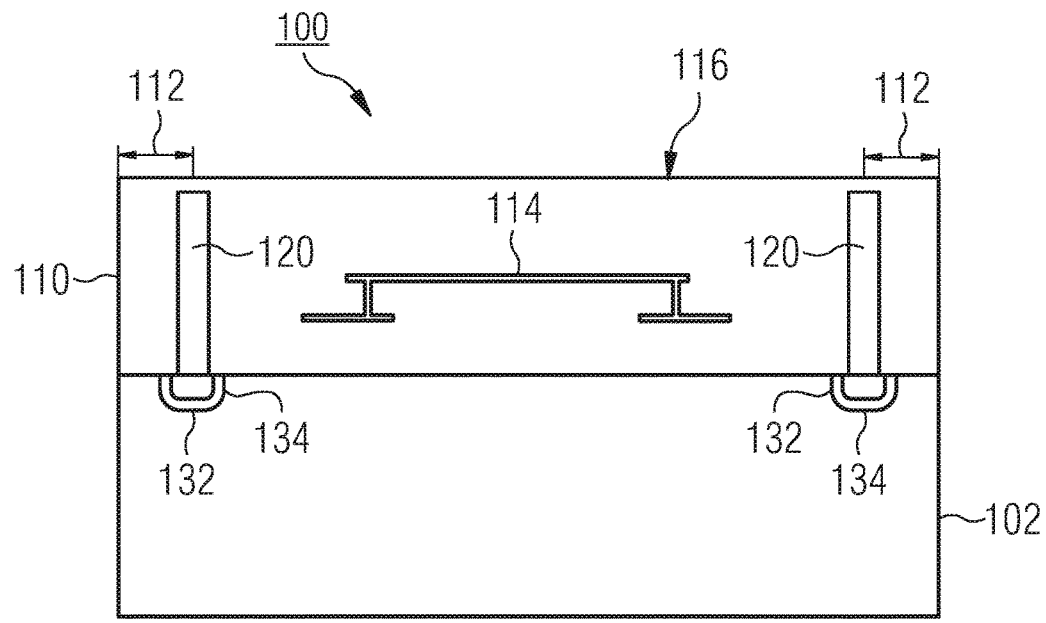
FIG. 1 shows a schematic cross section of a semiconductor device.

FIG. 1 shows a schematic cross section of a semiconductor device 100 according to an embodiment. The semiconductor device 100 comprises a crack propagation prevention structure 120. The crack propagation prevention structure 120 is located at an edge region 112 of a wiring layer stack 110 located on a semiconductor substrate 102 of the semiconductor device 100. Furthermore, the crack propagation prevention structure 120 laterally surrounds at least one wiring structure 114 located within the wiring layer stack 110. Additionally, the semiconductor device 100 comprises an insulation trench 132 extending into the semiconductor substrate 102. The insulation trench 132 comprises at least an insulation layer 134 electrically insulating the crack propagation prevention structure 120 from the semiconductor substrate 102. The crack propagation prevention structure 120 extends vertically at least from a surface 116 of the wiring layer stack 110 to the insulation trench 132.

A crack propagation prevention structure located at an edge region of a wiring layer stack and extending from a surface of the wiring layer stack to an insulation trench that extends into a semiconductor substrate of a semiconductor device and that comprises an insulation layer to insulate the crack propagation prevention structure from the semiconductor substrate, may increase the yield of the semiconductor device during manufacturing and may as well extend the lifetime of the semiconductor device.

For example, said crack propagation prevention structure may stop cracks that may occur at singulation edges (e.g., kerf and/or sawing streets) of a semiconductor device from propagating further into the semiconductor device. This may also prevent cracks from reaching and damaging electrical structures within the semiconductor device (e.g., wiring structures of a wiring layer stack of the semiconductor device). Hence electrical malfunctions of the semiconductor device may be prevented. This may prevent mechanical damage and/or mechanical destruction of the semiconductor device. For example, the crack propagation prevention structure may effectively block any paths for cracks from singulation edges of the semiconductor device through inter-metal dielectrics and/or inter-layer dielectrics of the wiring layer stack to the at least one wiring structure of the wiring layer stack. For example, the crack propagation prevention structure extends vertically (completely) from the surface 116 of the wiring layer stack 110 to the insulation trench 132 and (completely) laterally surrounds wiring structures 114 located within the wiring layer stack without any insulating material crossing or running through the crack propagation prevention structure.

For example, the crack propagation prevention structure may float during an operation of the semiconductor device by insulating the crack propagation prevention structure from the semiconductor substrate at least by the insulation layer of the insulation trench. Due to the electrical insulation between the crack propagation prevention structure and the semiconductor substrate, dendrite (e.g., crystallographic structures) growth, for example, from wiring structures of the wiring layer stack and/or packaging structures to the crack propagation prevention structure may be prevented as the growth of dendrites may otherwise be stimulated by potential differences between wiring structures of the wiring layer stack and the crack propagation prevention structure and/or the semiconductor substrate. For example, dendrite growth from a contact pad of the wiring layer stack through a package of the semiconductor device to a portion of the crack propagation prevention structure located at the surface of the wiring layer stack can be avoided or prevented by insulating the crack propagation prevention structure from the semiconductor substrate. As dendrites may be electrically conductive, a crack propagation prevention structure insulated from the semiconductor substrate and configured to float during an operation of the semiconductor device can reduce the risk of short circuits due to dendrites. Hence, the crack propagation prevention structure may make the semiconductor device more reliable and increase the lifetime of the semiconductor device.

For example, the insulation layer 134 of the insulation trench 132 may electrically insulate the crack propagation prevention structure 120 from an electric potential present at a region of the semiconductor substrate 102 located adjacent to the insulation layer 134 of the insulation trench 132. For example, a region of the semiconductor substrate 102 located adjacent to the insulation trench 132 may be at or close to a potential applied to a backside of the semiconductor substrate during operation of the semiconductor device. For example, a potential difference between the region of the semiconductor substrate 102 located adjacent to the insulation trench 132 and a wiring structure or contact pad within the region of the wiring stack enclosed by the crack propagation prevention structure 120 may exist. The insulation layer 134 of the insulation trench 132 may then prevent a potential difference between the drain and the source of the transistor structure that may also exist between the crack propagation prevention structure 120 and a contact wiring structure (e.g., pad) of the wiring layer stack 110. Hence, the insulation layer 134 of the insulation trench 132 may prevent forming of a dendrite between the contact wiring structure and the crack propagation prevention structure 120 stimulated by the potential difference.

For example, an electrically conductive trench structure (e.g., polysilicon or metal, for example, copper, aluminum, tungsten, silver, gold, or alloys thereof) may be located in the insulation trench 132 and may be electrically insulated from the semiconductor substrate 102 by the insulation layer 132. The crack propagation prevention structure 120 may comprise the electrically conductive trench structure or may be electrically connected to the electrically conductive trench structure.

In this way, the crack propagation prevention structure 120 may extend vertically from the electrically conductive trench structure to the surface of the wiring layer stack while being electrically insulated from the semiconductor substrate 102. The electrically conductive trench structure may be less susceptible for crack propagation (e.g., less brittle) than inorganic insulating solid materials of the wiring layer stack 110, which may avoid and/or prevent cracks from propagating through a filling of the insulation trench 132 (e.g., through the electrically conductive trench structure).

The insulation layer 134 may line the insulation trench 132 and may comprise, for example, oxides, such as a silicon-dioxide, and/or nitrides, such as silicon-nitride.

For example, the insulation trench 132, the insulation layer 134 and the electrically conductive trench structure may be formed simultaneously with gate trench structures (e.g., vertical gate trenches lined with insulating solid material and filled with electrically conductive material) of transistor structures that may be located at the front side surface of the semiconductor substrate 102 and/or may be formed simultaneously with other trench structures, such as deep insulation trenches and/or shallow insulation trenches that may be located at the front side surface of the semiconductor substrate 102.

A maximal depth of the insulation trench 132 may differ from a maximal depth of a gate trench of a transistor structure of the semiconductor device 100 by less than 20% (or less than 10% or less than 5%) of a maximal depth of the gate trench. In other words, the maximal depth of the insulation trench 132 may be at most 20% larger (or 10% larger, or 5% larger) than the maximal depth of a gate trench of a transistor structure of the semiconductor device 100, or may be at most 20% smaller (or 10% smaller, or 5% smaller) than the maximal depth of a gate trench of a transistor structure of the semiconductor device 100. For example, the insulation trench 132 may be formed simultaneously with a gate trench (or a plurality of gate trenches) of a transistor structure (or of a plurality of transistor structures, respectively) of the semiconductor device 100 so that the trenches have similar or equal depth.

A thickness of the insulation layer 134 of the insulation trench 132 may be substantially equal to a thickness of a gate oxide of a transistor structure located at the front side surface of the semiconductor substrate 102 or larger.

For example, cracks may be avoided and/or prevented from propagating through the insulation layer 134 of the insulation trench 132 from outside a region laterally enclosed by the insulation trench 132 and the crack propagation prevention structure 120 to the region laterally enclosed by the insulation trench 132 and the crack propagation prevention structure 120, because the combination of the electrically conductive trench structure and the insulation layer 134 of the insulation trench 132 may exclude any straight lateral paths through inorganic insulating solid materials for crack propagation from outside the region laterally enclosed by the insulation trench 132 and the crack propagation prevention structure 120 to the region laterally enclosed by the insulation trench 132 and the crack propagation prevention structure 120.

For example, the width of the insulation trench 132 at the front side surface (at the level of the front side surface) of the semiconductor substrate 102 may be at least 10% larger (or at least 20% larger, or at least 40% larger, or at least 80% larger) than a width of the crack propagation prevention structure 120 at the front side surface of the semiconductor substrate 102, and may be at most 150% (or at most 100%, or at most 70%, or at most 30%) larger than the width of the crack propagation prevention structure 120 at the front side surface of the semiconductor substrate 102. This way, a reliable insulation of the crack propagation prevention structure 120 from the semiconductor substrate 102 may be provided as well as a reliable contact between the crack propagation prevention structure 120 and the optional electrically conductive trench structure. This may increase the yield of the semiconductor device 100 during manufacturing and/or may increase the lifetime of the semiconductor device 100.

For example, the width of the crack propagation prevention structure at the front side surface (at the level of the front side surface) of the semiconductor substrate may be larger than 300 nm (or larger than 600 nm, or larger than 1 μm, or even larger than 3 μm) and/or may be smaller than 10 μm (or 5 μm, or 2 μm, or 700 nm).

For example, the crack propagation prevention structure 120 may be an electrically conductive structure configured to float during operating the semiconductor device 100. The crack propagation prevention structure may be electrically insulated from any wiring structures comprised by the wiring layer stack 110, such that the crack propagation prevention structure 120 may float in any state (e.g. also during operating the semiconductor device). Hence, it may be avoided that the crack propagation prevention structure might be biased to an electric potential of the semiconductor substrate or to an electric potential of a portion of the semiconductor substrate (e.g., to the electric potential of a drain doping region of the semiconductor substrate).

For example, the crack propagation prevention structure 120 may comprise an uppermost electrically conductive part located at a lateral wiring layer (e.g. metal layer of the wiring layer stack) or a pad metallization layer located at least partially at a surface 116 of the wiring layer stack 110 and located at the edge region 112 of the wiring layer stack 110. The uppermost electrically conductive part of the lateral wiring layer comprised by the crack propagation prevention structure 120 (and/or the electrically conductive part of the pad metallization layer comprised by the crack propagation prevention structure 120) may form a first crack propagation prevention loop as it may laterally form a closed loop along the edge region of the wiring layer stack 110. For example, the first crack propagation prevention loop may laterally surround at least one lateral wiring element (or all lateral wiring elements) of the lateral wiring layer that comprises the first crack propagation prevention loop (or may laterally surround at least one pad metallization element (or all pad metallization elements) of the pad metallization layer).

The insulation of the first crack propagation prevention loop and/or of the crack propagation prevention structure 120 from wiring structures of the wiring layer stack 110 may, for example, be accomplished by solid insulating materials of the wiring layer stack 110.

The crack propagation prevention structure 120 may further comprise a first vertical electrically conductive portion located at a vertical wiring layer (e.g. via layer) of the wiring layer stack. The first vertical electrically conductive portion may comprise electrically conductive material and may vertically extend from the bottom side surface of the first crack propagation prevention loop to the insulation trench 132 that extends vertically into the semiconductor substrate 102. The first vertical electrically conductive portion may be electrically connected to the first crack propagation prevention loop. The first vertical electrically conductive portion may laterally extend along the bottom side surface of the first crack propagation prevention loop along the edge region 112 of the wiring layer stack 110. In this way, the first vertical electrically conductive portion may form a closed loop like structure located below and vertically directly adjacent to the first crack propagation prevention loop.

The crack propagation prevention structure 120 or portions of the crack propagation prevention structure 120 (e.g. the crack propagation prevention loop and/or the vertical electrically conductive portion) may comprise metals (e.g., copper, aluminum, tungsten, and/or silver), metal-alloys (e.g., an aluminum-copper-alloy), polysilicon, and/or metal-polysilicon-alloys (e.g., an aluminum-silicon-copper-alloy).

Additionally, the crack propagation prevention structure 120 may comprise a second crack propagation prevention loop, if the wiring layer stack 110 comprises more than one lateral wiring layer or comprises a pad metallization layer and at least one lateral wiring layer located below the pad metallization layer. The second crack propagation prevention loop may be located at a lateral wiring layer of the wiring layer stack. The first vertical electrically conductive portion may then vertically extend from the bottom side surface of the first crack propagation prevention loop to a top side surface of the second crack propagation prevention loop located at the lateral wiring layer below the first crack propagation prevention loop.

The second crack propagation prevention loop may be similar to the first crack propagation prevention loop, such that the second crack propagation prevention loop may laterally form a closed loop along the edge region 112 of the wiring layer stack 110. For example, the second crack propagation prevention loop may be electrically insulated from all lateral wiring elements of the first buried lateral wiring layer in a manner similar to the insulation of the first crack propagation prevention loop as described above. The first vertical electrically conductive portion may be vertically located directly between the first crack propagation prevention loop and the second crack propagation prevention loop and may electrically connect the first crack propagation prevention loop with the second crack propagation prevention loop. A second vertical electrically conductive portion of the crack propagation prevention structure 120 (that is similar to the first vertical electrically conductive portion) comprising electrically conductive material may then extend vertically from a bottom side surface of the second crack propagation prevention loop to the insulation trench 132 that extends into the semiconductor substrate 102.

The wiring layer stack 110 may comprise further lateral and/or vertical wiring layers and the crack propagation prevention structure 120 may comprise portions at each of these wiring layers.

In this way, according to the number of lateral wiring layers that are located at the edge region 112 of the wiring layer stack 110 the above described pattern of crack propagation prevention loops and vertical electrically conductive portions may continue until an vertical electrically conductive portion of the crack propagation prevention structure 120 (or alternatively a crack propagation prevention loop of the crack propagation prevention structure 120) reaches the insulation trench 132 that extends into the semiconductor substrate 102. For example, the (first) crack propagation prevention loop (or a plurality of crack propagation prevention loops) and the (first) vertical electrically conductive portion (or a plurality of vertical electrically conductive portions) comprised by the crack propagation prevention structure 120 may form a closed loop like structure extending laterally along the edge region 112 of the wiring layer stack 110 and extending continuously in vertical direction at least from the surface 116 at the edge region 112 of the wiring layer stack 110 to a front side surface of the semiconductor substrate 102, in particular, to the insulation trench 132 that extends from the front side surface of the semiconductor substrate 102 into the semiconductor substrate 102. For example, the exemplary crack propagation prevention structure 120 may be insulated from any wiring structures comprised by the wiring layer stack 110 and may be insulated from the semiconductor substrate 102 by the insulation layer 134 of the insulation trench 132 and thus may be configured to float during operating the semiconductor device 100.

For example, a portion of the crack propagation prevention structure 120 (e.g., a crack propagation prevention loop) may be located at least in every lateral wiring layer (and vertical wiring layer) of the wiring layer stack 100 below the pad metallization layer of the wiring layer stack. Additionally, a portion of the crack propagation prevention structure 120 (e.g., a crack propagation prevention loop) may be located in the pad metallization layer of the wiring layer stack 110.

For example, a crack propagation prevention loop may be formed during the same process steps as lateral wiring elements of wiring structures of the wiring layer stack 110 that are located in the same lateral wiring layer of the wiring layer stack 110 as the crack propagation prevention loop during production of the semiconductor device 100. The vertical electrically conductive portions may be formed in the same process steps as vertical wiring elements (e.g. vias) of wiring structures that are located in the same vertical wiring layer of the wiring layer stack 110 as the vertical electrically conductive portion, for example. In this way, the forming of the crack propagation prevention structure 120 may be integrated into the production of the semiconductor device 100 without need of any additional process steps and/or any additional photolithographic masks.

Optionally and alternatively, one or more electrical conductive crack propagation prevention loops and/or one or more vertical electrically conductive portion may be removed to form a vertical gap in the wiring layer stack 110. Alternatively, a vertical gap may be formed (e.g. by etching) after forming the wiring layer stack. In other words, the crack propagation prevention structure may be a vertical gap in the wiring layer stack. This vertical gap may laterally extend along the edge region 112 of the wiring layer stack 110 to form a closed loop like gap in the first lateral wiring layer. The vertical gap may vertically extend to the insulation trench 132 that extends into the semiconductor substrate 102 (e.g. to the insulation layer in the insulation trench or an electrical conductive material, for example, poly silicon, located within the insulation trench, but insulated from the semiconductor substrate by the insulation layer) or to an electrical conductive crack propagation prevention loops or a vertical electrically conductive portion of the crack propagation prevention structure.

For example, the crack propagation prevention structure 120 may be a vertical gap (e.g., a trench) in the wiring layer stack 110. The vertical gap may extend at the edge region 112 of the wiring layer stack 110 from at least the surface 116 of the wiring layer stack 110 to the insulation trench 132 that extends into the semiconductor substrate 102. Optionally, the vertical gap in the wiring layer stack 110 may at least be partially filled by mold material of a semiconductor package structure of the semiconductor device 100. The vertical gap may be etched into the wiring layer stack 110 after the wiring layer stack 110 has been formed or has at least been partially formed during forming of the semiconductor device 100, for example. A vertical gap can stop crack propagation towards the part of the wiring layer stack laterally enclosed by the crack propagation prevention structure.

The wiring layer stack 110 of the semiconductor device 100 may, for example, be implemented without inorganic insulating solid material extending laterally along a straight line (e.g. along any straight line) from outside a region laterally enclosed by the crack propagation prevention structure 120 to the region laterally enclosed by the crack propagation prevention structure 120.

For example, the crack propagation prevention structure 120 may be comprised by the wiring layer stack 110 (e.g., may be located in the wiring layer stack 110). The crack propagation prevention structure 120 may comprise electrically conductive material and/or may comprise a vertical gap in the wiring layer stack 110 or may be a vertical gap in the wiring layer stack 110. Furthermore, the crack propagation prevention structure 120 may be implemented without inorganic insulating solid material. As the crack propagation prevention structure 120 may furthermore extend vertically at least from the surface 116 at the edge region 112 of the wiring layer stack 110 to the insulation trench 132 that extends into the semiconductor substrate 102, any straight line extending laterally from outside the region laterally enclosed by the crack propagation prevention structure 120 to the region laterally enclosed by the crack propagation prevention structure 120 may pass through the crack propagation prevention structure 120 and may hence either pass through electrically conductive material of the crack propagation prevention structure 120 or a vertical gap (that may be filled with mold material or air) comprised by the crack propagation prevention structure 120.

As inorganic insulating solid materials may often be more brittle compared to electrically conductive materials, such as metals or polysilicon, or compared to mold materials of semiconductor package structures, cracks propagating from singulation edges of the semiconductor device 100 laterally into the semiconductor device 100 through inorganic insulating solid material of the wiring layer stack 110 might hence not find any straight lateral path through inorganic insulating solid material into the region laterally enclosed by the crack propagation prevention structure 120 and may thus be stopped at the crack propagation prevention structure 120.

Alternatively, at least one continuous vertical electrically conductive portion comprised by the crack propagation prevention structure 120 may alternatively be replaced by a plurality of vias of electrically conductive material. These vias may be comprised by the crack propagation prevention structure 120 and may connect two crack propagation prevention loops or extend vertically from a crack propagation prevention loop to the insulation trench 132 extending into the semiconductor substrate 102. The plurality of vias may be arranged in a fence like structure that extends laterally along the edge region 112 of the wiring layer stack 110. For example, the fence like structure may comprise at least a first row of vias and a second row of vias. The vias of the second row may be laterally shifted with respect to the vias of the first row in circumferential direction of the fence like structure, such that gaps in circumferential direction between the vias of the first row are at least partially covered up by the vias of the second row. This may reduce the probability for a crack propagating through in-between the vias from outside the region laterally surrounded by the crack propagation prevention structure 120 to the region laterally surrounded by the crack propagation prevention structure 120.

For example, all wiring structures (or at least some wiring structures) comprised by the wiring layer stack 110 and connected to the semiconductor substrate 102 may be located within the region laterally surrounded by the crack propagation prevention structure 120. Thus, all wiring structures (or at least some wiring structures) comprised by the wiring layer stack 110 and connected to the semiconductor substrate 102 may effectively be protected against cracks. Due to the insulation provided to the crack propagation prevention structure 120 by the insulation layer 134 of the insulation trench 132 and by the inorganic insulating solid materials of the wiring layer stack 110, the wiring structures of the wiring layer stack 110 may also be better protected against short circuits that may otherwise be formed by electrically conductive dendrites growing between the wiring structures and the crack propagation prevention structure 120.

For example, if an vertical electrically conductive portion of the crack propagation prevention structure 120 may be located at a level of the front side surface of the semiconductor substrate 102, a width of the vertical electrically conductive portion located at the level of the front side surface of the semiconductor substrate 102 may be limited as described above (e.g., may be larger than 300 nm and smaller than 10 µm). For example, the width of the vertical electrically conductive portion located at the vertical level of the front side surface of the semiconductor substrate 102 and comprised by the crack propagation prevention structure 120 may be smaller than 80% (or smaller than 40%, or smaller than 20%) of the width of a crack propagation prevention loop adjacent to and located above the vertical electrically conductive portion located at the front side surface of the semiconductor substrate 102 and may be larger than 5% (or 10%, or 20%) of the width of the crack propagation prevention loop directly adjacent to and located above the vertical electrically conductive portion located at the front side surface of the semiconductor substrate 102. In this way, the vertical electrically conductive portion located at the front side surface of the semiconductor substrate 102 may form a reliable interconnection between the crack propagation prevention loop adjacent to and located above the vertical electrically conductive portion located at the front side surface of the semiconductor substrate 102 and, for example, an electrically conductive trench structure located in the insulation trench 132.

Vertical directions, vertical dimensions (e.g., depths), thicknesses of regions and/or of layers, and thicknesses of structures may, for example, be measured orthogonal to the front side surface of the semiconductor substrate 102. Lateral directions and lateral dimensions (e.g., lengths and widths) may be measured in parallel to the front side surface of the semiconductor substrate 102. If it is referred to a length and/or to a width of a region, of an area, of a structure and/or of a layer, the length designates the longer lateral dimension and the width designates the shorter lateral dimension of the structure and/or of the layer, for example.

For example, the crack propagation prevention structure 120 may extend continuously to the insulation trench along the edge region 112 of the wiring layer stack 110. The insulation trench 132 may be located anywhere under the crack propagation prevention structure 120 at the front side surface of the semiconductor substrate 102. The crack propagation prevention structure 120 may additionally laterally surround all wiring structures of the wiring layer stack 110. Furthermore, the optional electrically conductive trench structure 134 may be directly adjacent to the crack propagation prevention structure 120 anywhere under the crack propagation prevention structure 120 at the vertical level of the front side surface of the semiconductor substrate 102. The crack propagation prevention structure 120, the insulation trench 132 and optionally also the electrically conductive trench structure 134 may form lateral loop like structures, in which the crack propagation prevention structure 120 is located above the insulation trench 132 and the electrically conductive trench structure 134. This may provide a reliable insulation of the crack propagation prevention structure 120 from the semiconductor substrate 102, such that the crack propagation prevention structure 120 may be configured to float during operating the semiconductor device 100. Furthermore, this may reduce or eliminate cracks from propagating into the region of the wiring layer stack 110 laterally enclosed by the crack propagation prevention structure 120.

The wiring layer stack 110 located on the semiconductor substrate 102 may comprise one or more wiring structures. A wiring structure comprised by the wiring layer stack 110 may contact and/or interconnect circuit elements comprised by the semiconductor device 100, for example, transistors, diodes or capacitors located at or in the semiconductor substrate 102. For example, a wiring structure (e.g., source wiring structure or gate wiring structure) may connect doping regions (e.g., source doping regions) or gates of field-effect transistor structures located at the semiconductor substrate 102. A wiring structure may comprise a portion implementing a passive element (e.g., a resistor, an inductor or a capacitor).

A wiring structure may comprise one or more lateral wiring elements (e.g., metal lines and/or electrically conductive planes) of one or more lateral wiring layers of the wiring layer stack 110 and/or may comprise one or more pad metallization elements (e.g., contacts for external connections of the semiconductor device 100) of a pad metallization layer of the wiring layer stack 110. Furthermore, a wiring structure may comprise one or more vertical wiring elements (e.g., vias). Vertical wiring elements may be used for vertically connecting lateral wiring elements of different lateral wiring layers, and/or for contacting portions of the semiconductor substrate located at a surface of the semiconductor substrate, and/or for connecting lateral wiring elements with pad metallization elements.

The wiring layer stack 110 may furthermore comprise insulating materials used as inter-metal dielectrics and/or inter-layer dielectrics of the wiring layer stack 110. Insulating materials comprised by the wiring layer stack may, for example, be inorganic insulating solid materials, like silicon dioxide, silicon nitride, and/or spin-on glasses (SOG).

The edge region 112 of the wiring layer stack 110 may extend from the singulation edges of the semiconductor device 100 (e.g., from the singulation edges of a semiconductor die comprising the semiconductor substrate 102 and the wiring layer stack 110) towards the inside of the wiring layer stack 110 and may extend laterally along the singulation edges. For example, the edge region 112 may extend from an edge of the semiconductor substrate to an active region or cell region of the semiconductor substrate. The crack propagation prevention structure 120 is located at the edge region 112 of the wiring layer stack 110 and may represent a lateral limit of the edge region 112 towards the inside of the wiring layer stack 110. For example, the edge region 112 does not comprise any wiring structure of the wiring layer stack 110 that are employed for contacting, interconnecting and/or for forming electrical element structures (e.g., transistors, diodes and/or passive elements) comprised by the semiconductor device 100.

For example, the insulation trench 132 and the crack propagation prevention structure 120 may laterally surround an active region of the semiconductor substrate 102.

For example, all transistor structures and/or all diode structures of the semiconductor device 100 may be comprised by the active region of the semiconductor substrate 102. Moreover, the active region of the semiconductor substrate 102 of the semiconductor device 100 may be a part of the semiconductor substrate 102 used to conduct a substantial share of the currents through the semiconductor substrate 102 in an on-state or conducting state of the semiconductor device 100, for example, more than 90% (or more than 95% or 100%) of the currents through the semiconductor substrate 102 in an on-state or conducting state of the semiconductor device 100.

The insulation trench 132 may, for example, extend laterally along an edge termination region of the semiconductor substrate 102. The edge termination region of the semiconductor substrate 102 may extend along the singulation edges of the semiconductor substrate 102 and may laterally enclose the active area of the semiconductor substrate.

The semiconductor device 100 may optionally further comprise a semiconductor package structure comprising a mold material. The mold material may be in contact with the crack propagation prevention structure 120. For example, the crack propagation prevention structure 120 may at least be partially located at the surface 116 of the wiring layer stack 110, where the crack propagation prevention structure 120 may be in contact with the mold material. For instance, the semiconductor package structure may provide a passivation to the semiconductor die comprising the semiconductor substrate 102 and the wiring layer stack 110. The passivation provided by the semiconductor package structure may protect the semiconductor device 100 from environmental influences, such as heat, low temperatures, and/or moisture, such that arranging inorganic insulating solid material at the surface 116 of the wiring layer stack 110 above the crack propagation prevention structure 120 may be avoided. Otherwise, this additional inorganic insulating solid material located above the crack propagation prevention structure 120 at the surface 116 of the wiring layer stack 110 could provide paths for cracks to propagate into the region of the wiring layer stack 110 laterally enclosed by the crack propagation prevention structure 120. Mold material (comprising, for example, polymeric materials and/or polymer-ceramic-compound materials) may often be much less susceptible towards crack propagation and more ductile compared to inorganic insulating solid materials.

For example, the mold material of the semiconductor package structure may be continuously in contact with the crack propagation prevention structure 120 along a portion located at the surface of the wiring layer stack. The mold material may, for example, be continuously in contact with the crack propagation prevention structure 120 at the surface 116 of the wiring layer stack 110 along the edge region 112 of the wiring layer stack 110. For example, the mold material of the semiconductor package structure may be located above and (directly) adjacent to a portion of the crack propagation prevention structure 120 and at least a portion of the mold material may extend circumferentially along the edge region 112 of the wiring layer stack 110.

If, for example, the crack propagation prevention structure 120 is (partially) covered by inorganic insulating solid material at the edge region 112 of the wiring layer stack 110 after forming the wiring layer stack, a vertical gap or trench may be formed into the inorganic insulating solid material of the wiring layer stack 110 to uncover the crack propagation prevention structure 120 before forming the semiconductor package structure with the mold material in contact with the crack propagation prevention structure 120. The vertical gap may laterally extend along the crack propagation prevention structure 120 to form a lateral ring-shaped trench in the inorganic insulating solid material partially covering the crack propagation prevention structure 120. This vertical gap may then be at least partially filled with mold material, such that the mold material may be continuously in contact with the crack propagation prevention structure 120 along the edge region 112 of the wiring layer stack 110, for example.

For example, the surface 116 of the wiring layer stack 110 may be an interface surface between one or more back end of line structures and a package material formed during packaging. Alternatively, surface 116 of the wiring layer stack 110 may optionally be an interface surface between one or more back end of line structures and air.

Herein, the surface 116 of the wiring layer stack 110 may refer to a front side (e.g., top side) surface or outer surface of the wiring layer stack 110, that may be planar or may be nonplanar, e.g., comprise vertical steps and/or slopes. In contrast, internal surfaces of wiring layers in the wiring layer stack may be interfaces between wiring layers located inside the wiring layer stack 110 (e.g., at some distance from the surface 116 of the wiring layer stack 110). The wiring layer stack 110 may, for example, be formed during back end of line fabrication steps. Back end of line structures (e.g., parts of lateral and/or vertical wiring layers and/or a pad metallization layer) may form the surface 116 of the wiring layer stack 110, such that the surface 116 of the wiring layer stack 110 may form an interface surface with package material formed during packaging or may from an interface surface with air in case the semiconductor device 100 is at least partly unhoused or covered by a cap of a package, for example.

The wiring layer stack may comprise one or more lateral wiring layers and one or more vertical wiring layers and a pad metallization layer. A lateral wiring layer (e.g. metal layer) may be a layer for implementing lateral electrical connections between vertical electrical connections (vias) connecting lateral wiring layers. A vertical wiring layer (e.g. via layer, for example, an inter-metal dielectric layer or a pre-metal dielectric layer) may be a layer for implementing vertical electrical connections (vias) between lateral wiring layers.

The semiconductor substrate 102 may be a silicon substrate. Alternatively, the semiconductor substrate may be a wide band gap semiconductor substrate having a band gap larger than the band gap of silicon (1.1 eV). For example, the semiconductor substrate may be a silicon carbide (SiC)-based semiconductor substrate, or gallium arsenide (GaAs)-based semiconductor substrate, or a gallium nitride (GaN)-based semiconductor substrate. The semiconductor substrate may be a semiconductor wafer or a semiconductor die.

The semiconductor device may be a processor device, a memory device, a sensor device and/or a power semiconductor device, for example. A power semiconductor device or an electrical structure (e.g. transistor arrangement of the semiconductor device and/or diode arrangement of the semiconductor device) of the power semiconductor device may have a breakdown voltage or blocking voltage of more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

The at least one wiring structure may be a source wiring structure or a gate wiring structure of a transistor arrangement. The transistor arrangement (e.g. insulated gate field effect transistor IGFET, metal-oxide-semiconductor field effect transistor MOSFET or insulated gate bipolar transistor IGBT) may be a vertical transistor structure conducting current between a front side surface of the semiconductor substrate and a back side surface of the semiconductor substrate. For example, the transistor arrangement of the semiconductor device comprises a plurality of source doping regions connected to a source wiring structure, a plurality of gate electrodes or a gate electrode grid connected to a gate wiring structure and a back side drain metallization, for example.

Figure 2:
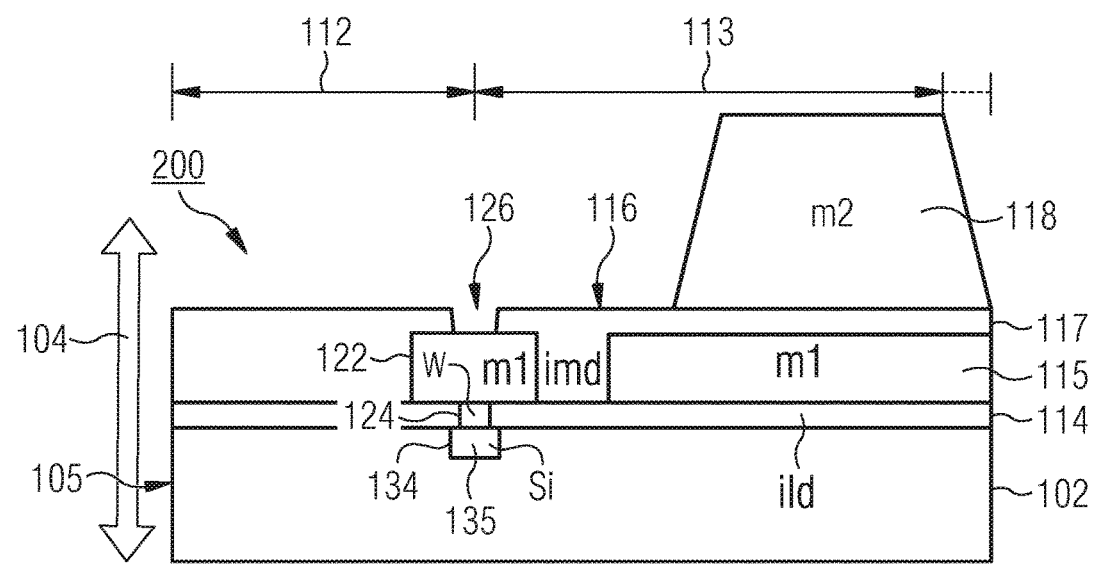
FIG. 2 shows a schematic cross section of a portion of a semiconductor device.

FIG. 2 shows a schematic cross section of a portion of a semiconductor device 200. The semiconductor device 200 as displayed in FIG. 2 may be similar to the semiconductor device 100 of FIG. 1. FIG. 2 does not show an entire cross section of the semiconductor device 200, but a detailed view of the semiconductor device 200 at a sawing street 104.

An edge region 112 of a wiring layer stack of the semiconductor device 200 extends laterally from a sawing edge 105 of the semiconductor device 200 towards the inside of the wiring layer stack to a crack propagation prevention structure located in the wiring layer stack. The crack propagation prevention structure may laterally surround a region 113 of the wiring layer stack. The region 113 laterally surrounded by the crack propagation prevention structure is only shown partially in FIG. 2.

A first inorganic insulating solid material layer 117 (e.g., an inter-metal dielectric) is located at least partially at the surface 116 of the wiring layer stack. A first portion of the first inorganic insulating solid material layer extends laterally from the sawing edge 105 to a crack propagation prevention loop 122 and to a vertical gap 126 in the first inorganic insulating solid material layer 117. The crack propagation prevention loop 122 is comprised by the crack propagation prevention structure and is located in the first inorganic insulating solid material layer 117. The vertical gap 126 is located above the crack propagation prevention loop 122 and extends vertically into the first inorganic insulating solid material layer to the top side surface of the crack propagation prevention loop 122, such that at least a portion of the top side surface of the crack propagation prevention loop 122 becomes uncovered from inorganic insulating solid material and becomes a part of the surface 116 of the wiring layer stack. The vertical gap 126 may at least be partially filled with mold material of a semiconductor package structure or may form an air pocket between a semiconductor package structure and the wiring layer stack of the semiconductor device 200.

The top side surface of the crack propagation prevention loop 122 as shown in FIG. 2 is partially covered with inorganic insulating solid material, but may alternatively be completely free of inorganic insulating solid material if the vertical gap is at least as wide as the crack propagation prevention loop 122, for example. In another alternative, the crack propagation prevention loop 122 may be located directly at the surface 116 of the wiring layer stack without a vertical gap 126, such that the top side surface of the crack propagation prevention loop 122 may be completely comprised by the surface 116 of the wiring layer stack. Additionally, a thin insulating layer (e.g., an etch stop layer and/or a passivation layer) may be located on the top side surface of the crack propagation prevention loop 122 between the crack propagation prevention loop 122 and the vertical gap 126. The thin insulating layer may comprise titanium nitride and may comprise a thickness smaller than 500 nm (or smaller than 200 nm, or smaller than 50 nm), for example.

A second portion of the first inorganic insulating solid material layer 117 extends laterally from the crack propagation prevention loop 122 towards the inside of the wiring layer stack and may extend laterally across the entire region 113 laterally enclosed by the crack propagation prevention structure. A first lateral wiring element 115 is located in the second portion of the first inorganic insulating solid material layer 117 at a vertical distance substantially equal to the depth of the vertical gap (e.g., differing by less than 10%) from the top side surface of the first inorganic insulating solid material layer 117 and extends vertically in parallel to the crack propagation prevention loop 122.

The first inorganic insulating solid material layer 117 may have a thickness larger than 1 µm (or larger than 2 µm, or larger than 5 µm) and/or smaller than 10 µm (or smaller than 5 µm, or smaller than 2 µm), for example.

The crack propagation prevention loop 122 may have a thickness larger than 500 nm (or larger than 1 µm, or larger than 4 µm) and/or smaller than 10 µm (or smaller than 5 µm, or smaller than 2 µm), for example.

The crack propagation prevention loop 122 and the first lateral wiring element 115 are electrically insulated from each other by a share of the second portion of the first inorganic insulating solid material layer 117. The crack propagation prevention loop 122 and the first lateral wiring element 115 may be simultaneously formed out of a metallization layer of the wiring layer stack during production of the semiconductor device 200.

Furthermore, the crack propagation prevention loop 122 and the first lateral wiring element 115 extend vertically to a second inorganic insulating solid material layer 114 (e.g., an inter-layer dielectric) of the wiring layer stack. The second inorganic insulating solid material layer 114 is vertically located between a semiconductor substrate 102 of the semiconductor device 200 and the first inorganic insulating solid material layer 117. For example, the second inorganic insulating solid material layer 114 is at least partially directly adjacent to the first inorganic insulating solid material layer 117 and is at least partially directly adjacent to the semiconductor substrate 102.

Moreover, the crack propagation prevention structure comprises a vertical electrically conductive portion 124. The vertical electrically conductive portion 124 extends from the bottom side surface of the crack propagation prevention loop 122 through the second inorganic insulating solid material layer 114 to an electrically conductive trench structure 135, such that the vertical electrically conductive portion 124 is electrically connected to the electrically conductive trench structure 135 and in direct contact with the electrically conductive trench structure 135. The width of the vertical electrically conductive portion 124 is smaller than the width of the crack propagation prevention loop 122, but may also be as large as or larger than the width of the crack propagation prevention loop 122. The vertical electrically conductive portion 124 separates the second inorganic insulating solid material layer 114 into a first portion and into a second portion. The first portion of the second inorganic insulating solid material layer 114 extends laterally from the sawing edge 105 to the vertical electrically conductive portion 124. The second portion of the second inorganic insulating solid material layer 114 extends laterally from the vertical electrically conductive portion 124 towards the inside of the wiring layer stack and may extend laterally across the entire region 113 laterally surrounded by the crack propagation prevention structure. The vertical electrically conductive portion 124 may be electrically insulated from any wiring structures of the wiring layer stack. The vertical electrically conductive portion 124 may comprise tungsten and/or tungsten-alloys, for example.

The electrically conductive trench structure 135 is located in an insulation trench extending into the semiconductor substrate 102. The electrically conductive trench structure 135 may be a filling of the insulation trench with polysilicon (and/or metal), for example. The insulation trench is lined with an insulation layer 134, such that the electrically conductive trench structure 135 and the crack propagation prevention structure are electrically insulated from the semiconductor substrate 102. For example, the insulation trench may extend into a drain doping region (or collector doping region, or another electrically active region) of the semiconductor substrate 102. The insulation layer 134 of the insulation trench may then insulate the electrically conductive trench structure 135 (and thus also the crack propagation prevention structure) from a drain potential (or collector potential or another electric potential of the semiconductor substrate 102 at the insulation trench) during operating the semiconductor device 200. This may prevent a potential difference existing between the crack propagation prevention structure and wiring structures of the wiring layer stack. Hence a short-circuiting of wiring structures of the wiring layer stack with the drain doping region (or collector doping region or another electrically active region) of the semiconductor substrate 102 due to dendrite growth may be avoided and/or prevented.

A contact pad 118 of the wiring layer stack is located (directly) above the second portion of the inorganic insulating solid material layer 117 and above the first lateral wiring element 115. The surface 116 of the wiring layer stack is nonplanar due to the arrangement of the contact pad 118 on the first inorganic insulating solid material layer 117 and due to the vertical gap 126 extending into the first inorganic insulating solid material layer 117. The contact pad, the crack propagation prevention loop 122 and the first inorganic insulating solid material layer 117 are back end of line structures that are located at the surface 116 of the wiring layer stack and that may form an interface surface with a package material (e.g., mold material) during packing or that may form an interface surface with air.

In case the semiconductor device 200 is packaged (e.g., with mold material) dendrites may be prevented from growing between the contact pad 118 (and/or solder material attached to the contact pad 118) and the crack propagation prevention loop 122 through package material (e.g., mold material) due to the electrical insulation of the crack propagation prevention structure from the semiconductor substrate 102 provided by the insulation layer 134 and/or due the floating of the crack propagation prevention structure during operating the semiconductor device 200.

The contact pad 118 is vertically separated from the first lateral wiring element 115 by a share of the second portion of the inorganic insulating solid material layer 117, but may be electrically connected to the first lateral wiring element 115 by one or more vertical wiring elements (e.g., a vias) that may extend vertically from the bottom side surface of the contact pad 118 to the first lateral wiring element 115 and/or to additional lateral wiring elements in the first inorganic insulating solid material layer 117. For example, the contact pad 118 may have a thickness larger than twice (or larger than three times, or larger than five times) the thickness of the first lateral wiring element 115 and/or smaller than ten times (or smaller 4 times) the thickness of the first lateral wiring element 115, because the contact pad 118 may conduct a current that may be higher (e.g., more than twice as high, more than five times as high, or more than ten times as high) as the current conducted by the first lateral wiring element 115. For example, the contact pad may distribute a current to and/or combine currents from a plurality of lateral wiring elements located in the first inorganic insulating solid material layer 117.

The first lateral wiring element 115 may represent a contact of a source doping region (or a drain doping region, or an emitter doping region, or a collector doping region) of a transistor structure located at the semiconductor substrate 102, for example. A plurality of lateral wiring elements located in the first inorganic insulating solid material layer 117 may represent contacts of a plurality of source doping regions (or drain doping regions, or emitter doping regions, or collector doping regions) of a plurality of transistor structures (e.g., transistor cells) located at the semiconductor substrate 102, for example.

For example, the transistor structure and/or the plurality of transistor structures may be comprised by a vertical or lateral transistor (e.g. a double-diffused metal-oxide semiconductor (DMOS) field effect transistor (FET), an insulated gate bipolar transistor IGBT and/or a lateral metal-oxide field effect transistor (MOSFET) and/or a junction gate field effect transistor (JFET) and/or a bipolar transistor) located at least partially in the semiconductor substrate 102. In an application, the vertical or lateral transistor may, for example, serve to switch load currents applied from external to the semiconductor device 200 to either pass or not to pass through the semiconductor device 200. These load currents may, for example, be higher than 500 mA (or higher than 1 A, higher than 5 A, higher than 20 A, or even higher than 40 A). For example, a vertical transistor may comprise a current path for these load currents from the front side surface of the semiconductor substrate 102 to the backside surface of the semiconductor substrate 102. The backside surface of the semiconductor substrate 102 may be connected to a backside electrode that may represent a drain contact (or a source contact, or a collector contact, or an emitter contact, respectively).

Referring to FIG. 2, a trench (e.g., an insulation trench for insulating the crack propagation prevention structure from the semiconductor substrate 102) may be made at gate formation (e.g., during trench edge/etch definition), lined with gate oxide and then filled with gate silicon, but may be disconnected from gate potential and/or any other electric potentials. Moreover, the crack prevention structure (e.g., the crack propagation prevention structure) may be disconnected from drain (e.g., a drain doping region of a transistor structure located at the semiconductor substrate 102). This may reduce the occurrence of copper-dendrites and/or silver-dendrites.

More details and aspects are mentioned in connection with the embodiments described above or below. The embodiment shown in FIG. 2 may comprise one or more optional additional features corresponding to one or more aspects mentioned in connection with the proposed concept or one or more embodiments described above (e.g. FIG. 1) or below (e.g. FIGS. 3-7).

FIG. 3 shows a schematic cross section of a portion of another semiconductor device 300. The semiconductor device 300 as displayed in FIG. 3 may be similar to the semiconductor device 200 of FIG. 2. FIG. 3 does not show an entire cross section of the semiconductor device 300, but a detailed view of the semiconductor device 300 at a sawing street 104.

Compared to the semiconductor device 200 of FIG. 2, the crack propagation prevention structure of the semiconductor device 300 of FIG. 3 solely comprises a vertical gap 126 in a wiring layer stack of the semiconductor device 300. The vertical gap 126 extends vertically entirely through a first inorganic insulating solid material layer 117 and entirely through a second inorganic insulating solid material layer 114 of the wiring layer stack directly to an electrically conducting trench structure 135 located in an insulation trench. The insulation trench extends vertically into a semiconductor substrate 102 of the semiconductor device 300. An insulation layer 134 insulates the electrically conducting trench structure 135 from the semiconductor substrate 102.

Cracks initiated at a sawing edge 105 of the semiconductor device 300 and propagating towards the inside of the semiconductor device 300 may be stopped at the vertical gap 126 and may hence be prevented from propagating into the region 113 laterally enclosed by the crack propagation prevention structure. The vertical gap may be partially filled with (or completely filled with) mold material of a semiconductor package structure or form an air pocket located in the wiring layer stack and covered by a semiconductor package, for example.

Dendrites may be prevented from growing between a contact pad 118 of the wiring layer stack and the semiconductor substrate 102 via the vertical gap 126 (e.g., via a filling of the vertical gap with package material of a semiconductor package structure) due to the insulation layer 134 of the insulation trench and/or due to an optional air pocket formed by the vertical gap 126.

More details and aspects are mentioned in connection with the embodiments described above or below. The embodiment shown in FIG. 3 may comprise one or more optional additional features corresponding to one or more aspects mentioned in connection with the proposed concept or one or more embodiments described above (e.g. FIGS. 1-2) or below (e.g. FIGS. 4-7).

FIG. 4 shows a schematic top view of a semiconductor device 400. The semiconductor device 400 as displayed in FIG. 4 may be similar to the semiconductor device 100 of FIG. 1, the semiconductor device 200 of FIG. 2, and/or the semiconductor device 300 of FIG. 3.

The semiconductor device 400 comprises a plurality of singulation edges 105 (e.g., four singulation edges). An edge region of a wiring layer stack extends laterally along the singulation edges 105. A crack propagation prevention structure 120 is located at the edge region and extends continuously laterally along the edge region. For example, the edge region may be located laterally between the singulation edges 105 and the crack propagation prevention structure 120.

The crack propagation prevention structure may laterally surround all wiring structures of the wiring layer stack. The wiring layer stack may be implemented without any wiring structures outside the region laterally enclosed by the crack propagation prevention structure 120. FIG. 4 shows, how the crack propagation prevention structure 120 laterally surrounds a first contact pad 442 and a second contact pad 450 that are located at the surface (e.g., the front side surface) of the wiring layer stack. The first contact pad 442, the second contact pad 450, as well as the crack propagation prevention structure 120 are back end of line structures comprising an interface surface with air or with a package material (e.g., mold material) of a semiconductor package structure that may be formed around the semiconductor device 400.

For example, the first contact pad 442 may be a source (or emitter) contact pad, and the second contact pad 450 may be a gate (or base) contact pad of a transistor structure located at a semiconductor substrate of the semiconductor device 400. The backside surface of the semiconductor substrate (not visible in FIG. 4) may be contacted by a backside electrode (e.g., a backside contact pad) that may represent a drain (or collector) contact pad.

The crack propagation prevention structure 120 is insulated from the first contact pad 442 and the second contact pad 450 and may be insulated from any other wiring structures of the wiring layer stack. Furthermore, the crack propagation prevention structure 120 extends vertically from the surface of the wiring layer stack to an insulation trench that extends vertically into the semiconductor substrate of the semiconductor device 400. As described above, the insulation trench comprises an insulation layer, so that the crack propagation prevention structure 120 is insulated from the semiconductor substrate and can float during operating the semiconductor device 400. The insulation trench located under the crack propagation prevention structure 120 may extend continuously laterally along the singulation edges 105 of the semiconductor device 400 (e.g., next to the singulation edges 105 and below the crack propagation prevention structure 120), such that it may laterally surround an active region of the semiconductor substrate of the semiconductor device 400.

More details and aspects are mentioned in connection with the embodiments described above or below. The embodiment shown in FIG. 4 may comprise one or more optional additional features corresponding to one or more aspects mentioned in connection with the proposed concept or one or more embodiments described above (e.g. FIGS. 1-3) or below (e.g. FIGS. 5-7).

Figure 5:
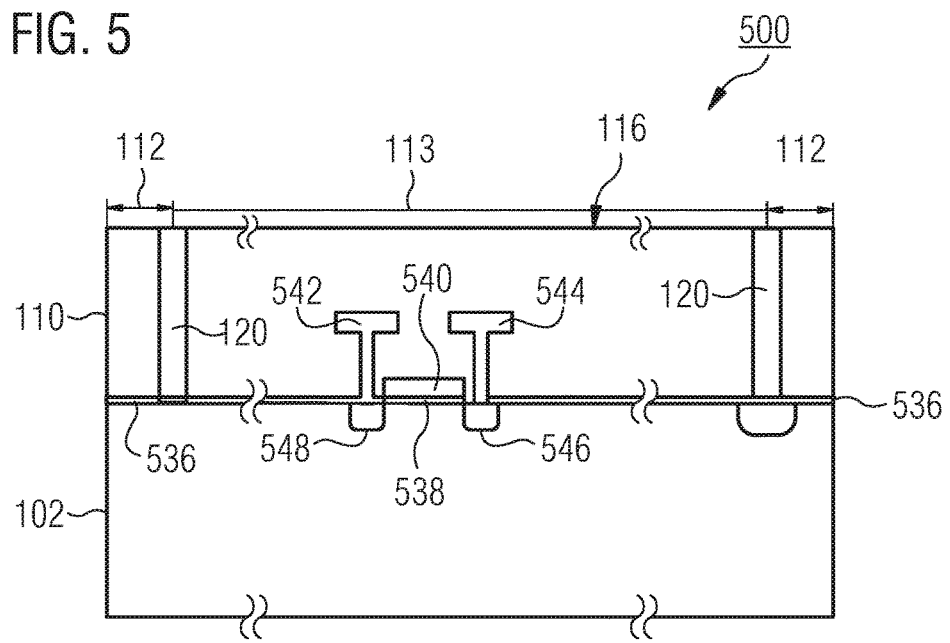
FIG. 5 shows a schematic cross section of a semiconductor device.

FIG. 5 shows a schematic cross section of a semiconductor device 500 according to an embodiment. The semiconductor device 500 comprises a crack propagation prevention structure 120 located at an edge region 112 of a wiring layer stack 110 of the semiconductor device 500. The wiring layer stack 110 is located on a semiconductor substrate 102 of the semiconductor device 500. The crack propagation prevention structure 120 laterally surrounds at least one wiring structure located within the wiring layer stack 110. Moreover, the crack propagation prevention structure 120 is an electrically conductive structure configured to float during operating the semiconductor device 500. The crack propagation prevention structure 120 extends vertically at least from a surface 116 of the wiring layer stack 110 to a vertical distance from the semiconductor substrate 102 equal to or less than a thickness of a gate oxide 538 of a transistor structure of the semiconductor device 500.

For example, the crack propagation prevention structure 120 may extend from the surface of the wiring layer stack 110 to an insulation layer 536 that may be vertically located between the crack propagation prevention structure 120 and the semiconductor substrate 102. Alternatively to an insulation layer 536, a portion of an insulating material comprised by the wiring layer stack may be vertically located between the crack propagation prevention structure 120 and the semiconductor substrate 102. The insulation layer 536 may be (directly) adjacent to the crack propagation prevention structure 120 and/or may be directly adjacent to the semiconductor substrate 102. The insulation layer 536 may laterally extend to the singulation edges of the semiconductor device 500 and may laterally extend towards the inside of the semiconductor device 500. The insulation layer 536 may be formed simultaneously with the gate oxide 538 (or a plurality of gate oxides) of a transistor structure (or of a plurality of transistor structures) of the semiconductor device 500. For example, the insulation layer 536 and/or the gate oxide 538 may comprise silicon dioxide.

For example, the crack propagation prevention structure 120 may vertically extend to a vertical distance from the semiconductor substrate smaller than 50 nm (or smaller than 10 nm, or smaller than 5 nm) and/or larger than 100 pm. Correspondingly a thickness of the insulation layer 536 located vertically between the crack propagation prevention structure 120 and the semiconductor substrate 102 may be less than 50 nm (or less than 10 nm, or less than 5 nm) and/or more than 100 pm.

The crack propagation prevention structure 120 of the semiconductor device 500 shown in FIG. 5 may comprise at least one crack propagation prevention loop and/or at least one vertical electrically conductive portion. In case of at least one crack propagation prevention loop and of at least one vertical electrically conductive portion, the at least one crack propagation prevention loop and the at least one vertical electrically conductive portion may be stacked on top of each other (e.g., may be vertically directly adjacent) to form a crack propagation prevention structure. This crack propagation prevention structure may extend at least from the surface of the wiring layer stack 110 to a vertical distance from the semiconductor substrate 102 equal to or less than a thickness of a gate oxide 538 of a transistor structure of the semiconductor device 500. Similarly to shown in FIG. 2, a vertical gap may extend into the wiring layer stack 110, such that the top side surface of the crack propagation prevention structure 120 (e.g., of a crack propagation prevention loop) may be at least partially comprised by the surface 116 of the wiring layer stack 110. Alternatively, the crack propagation prevention structure 120 may comprise a trench filled with electrically conductive material (e.g., metal, metal-alloy, polysilicon, and/or metal-polysilicon-alloy) extending from the surface 116 of the wiring layer stack 110 to a vertical distance from the semiconductor substrate 102 equal to or less than a thickness of a gate oxide 538 of a transistor structure of the semiconductor device 500.

The transistor structure comprising the gate oxide 538 may be a lateral MOSFET, for example. The transistor structure may comprise a source doping region 548 and a drain doping region 546. The source doping region 548 may be contacted by a source wiring structure 542. The drain region 546 may be contacted by a drain wiring structure. Furthermore, the transistor structure may comprise a gate wiring structure 540 (e.g., a gate electrode) located above the gate oxide 538. The source wiring structure 548, the drain wiring structure 546, and the gate wiring structure 540 are laterally surrounded by the crack propagation prevention structure 120 such that they are protected from cracks that may be initiated at the singulation edges of the semiconductor device 500. The source wiring structure 548, the drain wiring structure 546, and the gate wiring structure 540 are protected from short circuits due to dendrite growth by the insulation layer 536.

The wiring layer stack 110 of the semiconductor device 500 may be implemented at a distance from the semiconductor substrate larger than the thickness of the gate oxide without inorganic insulating solid material extending laterally along a (e.g., any) straight line from outside a region 113 laterally enclosed by the crack propagation prevention structure 120 to the region 113 laterally enclosed by the crack propagation prevention structure 120. Thus, cracks initiated at singulation edges of the semiconductor device 500 and propagating laterally through inorganic insulating solid material of the edge region 112 towards the inside of the semiconductor device 500 may be stopped at the crack propagation prevention structure 120 and be prevented from traveling further into the semiconductor device 500 (e.g., to wiring structures of the wiring layer stack 110). Moreover, cracks may be avoided and/or prevented from propagating through the insulation layer 536 that is located between the crack propagation prevention structure 120 and the semiconductor substrate 102, because the insulation layer 536 may comprise an inorganic insulating solid material (e.g., silicon dioxide) that may be less brittle (e.g., less susceptible to cracks) than other inorganic insulating solid materials (e.g., low-k insulating materials) comprised by the wiring layer stack, for example.

The crack propagation prevention structure 120 may be configured to float during operating the semiconductor device 500 due to the vertical distance between the crack propagation prevention structure 120 and the semiconductor substrate 102 and/or due to the insulation layer 536 located between the crack propagation prevention structure 120 and the semiconductor substrate 102. This may prevent forming of dendrites between wiring structures of the wiring layer stack 110 and the crack propagation prevention structure 120.

For example, the crack propagation prevention structure 120 of the semiconductor device 500 may be implemented in semiconductor devices whose manufacturing process do not comprise trench technologies as opposed to the semiconductor device 100 of FIG. 1 whose manufacturing process may include a trench technology. In this way, additional manufacturing steps may be avoided when implementing crack propagation prevention structures according to embodiments of the present disclosure.

More details and aspects are mentioned in connection with the embodiments described above or below. The embodiment shown in FIG. 5 may comprise one or more optional additional features corresponding to one or more aspects mentioned in connection with the proposed concept or one or more embodiments described above (e.g. FIGS. 1-4) or below (e.g. FIGS. 6-7).

Figure 6:
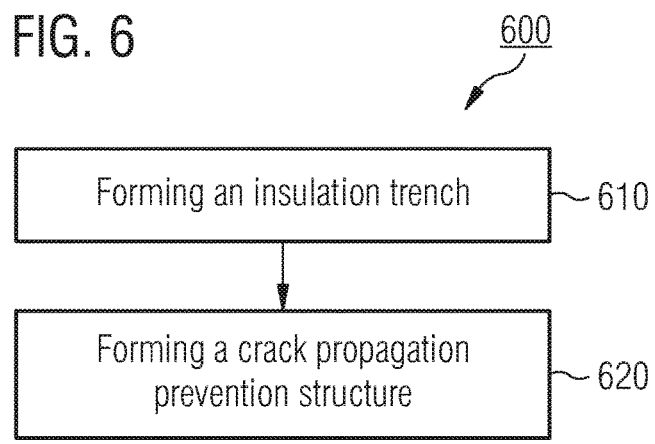
FIG. 6 shows a flow chart of a method for forming a semiconductor device.

FIG. 6 shows a flow chart of a method 600 for forming a semiconductor device. The method 600 comprises forming 610 an insulation trench extending from a front side surface of a semiconductor substrate of the semiconductor device into the semiconductor substrate. The insulation trench comprises at least an insulation layer. Furthermore, the method 600 comprises forming 620 a crack propagation prevention structure located at an edge region of a wiring layer stack. The wiring layer stack is located on the front side surface of the semiconductor substrate. The crack propagation prevention structure laterally surrounds at least one wiring structure located within the wiring layer stack. Moreover, the crack propagation prevention structure extends vertically at least from the surface of the wiring layer stack to the insulation trench. The insulation layer of the insulation trench electrically insulates the crack propagation prevention structure from the semiconductor substrate.

Implementing a crack propagation prevention structure at an edge region of a wiring layer stack may prevent cracks from propagating to a region of the wiring layer stack laterally enclosed by the crack propagation prevention structure and may prevent dendrites from growing between wiring structures of the wiring layer stack and the crack propagation prevention structure. This may increase the yield during manufacturing of semiconductor devices, and/or may increase the lifetime of semiconductor devices, and/or may make the operation of semiconductor devices more reliable.

For example, the insulation trench may be formed simultaneously with gate trenches of transistor structures located at the front side surface of the semiconductor device and/or may be formed simultaneously with deep insulation trenches or shallow insulation trenches of the semiconductor device. Deep insulation trenches and/or shallow insulation trenches may be provided to laterally insulate electrical element structures (e.g., transistor structures and/or diode structures) located at least partially at the front side surface of the semiconductor substrate, for example.

Moreover, the crack propagation prevention structure may be formed simultaneously with the wiring layer stack. For example, if the crack propagation prevention structure comprises at least one crack propagation prevention loop and/or at least one vertical electrically conductive portion, the at least one crack propagation prevention loop may be formed simultaneously with forming at least one lateral wiring element of the wiring layer stack, and the vertical electrically conductive portion may be formed simultaneously with forming at least one vertical wiring element of the wiring layer stack. Alternatively, the crack propagation prevention structure may be formed at least partially after having formed the wiring layer stack as a trench filled with electrically conductive material (e.g., metal and/or metal-alloys) or as a vertical gap. The vertical gap may optionally be filled with package material (e.g., mold material) of a semiconductor package structure. For example, the trench or the vertical gap may extend from the surface of the wiring layer stack to the insulation trench extending into the semiconductor substrate. Alternatively, the vertical gap may extend into the wiring layer stack to a crack propagation prevention loop or to a vertical electrically conductive portion comprised by the crack propagation prevention structure.

More details and aspects are mentioned in connection with the embodiments described above or below. The embodiment shown in FIG. 6 may comprise one or more optional additional features corresponding to one or more aspects mentioned in connection with the proposed concept or one or more embodiments described above (e.g. FIGS. 1-5) or below (e.g. FIG. 7).

Figure 7:
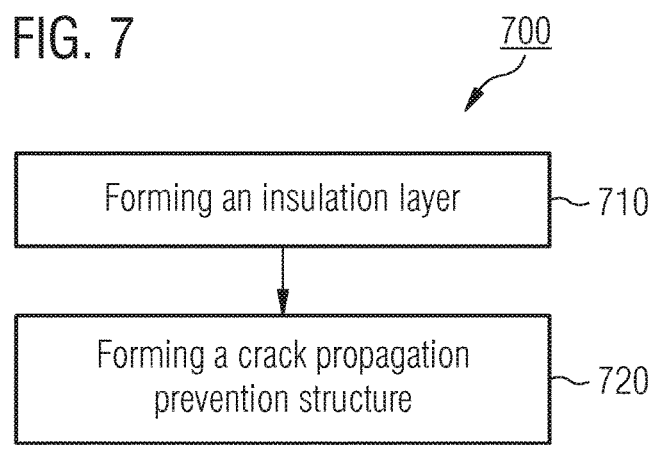
FIG. 7 shows a flow chart of a method for forming a semiconductor device.

FIG. 7 shows a flow chart of a method 700 for forming a semiconductor device. The method 700 comprises forming 710 an insulation layer on a front side surface of a semiconductor substrate of the semiconductor device at least at an edge region of the semiconductor substrate. The insulation layer comprises a thickness equal to or less than a thickness of a gate oxide of a transistor structure of the semiconductor device. Additionally, the method 700 comprises forming 720 a crack propagation prevention structure located at an edge region of a wiring layer stack. The wiring layer stack is located on the semiconductor substrate of the semiconductor device. The crack propagation prevention structure laterally surrounds at least one wiring structure located within the wiring layer stack. Moreover, the crack propagation prevention structure is an electrically conductive structure configured to float during operating the semiconductor device. The crack propagation prevention structure extends vertically at least from a surface of the wiring layer stack to the insulation layer formed on the front side surface of the semiconductor substrate.

The method 700 may, for example, be employed for implementing a crack propagation prevention structure at an edge region of a wiring layer stack if the forming of the semiconductor device (e.g., the manufacturing process) does not comprise forming of trenches (e.g., gate trenches, deep insulation trenches, and/or shallow insulation trenches). In this way, the method 700 may avoid additional manufacturing steps and may avoid a costly trench technology for forming the semiconductor device. The insulation layer vertically located between the crack propagation prevention structure and the semiconductor substrate may be formed simultaneously with a gate oxide (or a plurality of gate oxides) of a transistor structure (or of a plurality of transistor structures).

More details and aspects are mentioned in connection with the embodiments described above or below. The embodiment shown in FIG. 7 may comprise one or more optional additional features corresponding to one or more aspects mentioned in connection with the proposed concept or one or more embodiments described above (e.g. FIGS. 1-6).

Some embodiments relate to a drain isolated crack prevention ring (e.g., a crack propagation prevention structure). The crack prevention ring may be isolated from a drain potential, which may inhibit the growth of dendrites (e.g., silver or copper dendrites) from source to drain, for example. For example, a purpose may be to inhibit dendrite growth from source to drain by isolating the crack prevention ring from the drain potential. Dendrite growth may then be avoided and/or prevented under a biased moisture test, for example, and real world reliability of the semiconductor device may be enhanced. By placing a floating trench underneath the crack protection structure (e.g., the crack propagation prevention structure) this may remove the drain potential and may reduce the risk of dendrite growth.

Furthermore, a feature may be to isolate the crack ring (e.g., the crack propagation prevention structure) from drain—whilst still providing a crack prevention. Moreover, extra masks or fab steps may be avoided and/or the reliability of the system may be still further increased. The crack prevention ring may be uncovered at the surface of the wiring layer stack from inorganic insulating solid materials as this may avoid a new crack routing path between the crack prevention ring and the surface of the wiring layer stack.

Other semiconductor devices may relate to devices, where cracks may be prevented from propagating from the saw street through the oxide by the total removal of a section of oxide in the street. However, the crack ring (e.g., the crack propagation prevention structure) may be at drain potential due to a contact through a W-plug (e.g., a vertical electrically conductive portion). In a temperature humidity bias test this may assist dendrite formation between source and drain.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A semiconductor device comprising:
    a crack propagation prevention structure located at an edge region of a wiring layer stack located on a semiconductor substrate of the semiconductor device, wherein the crack propagation prevention structure laterally surrounds at least one wiring structure located within the wiring layer stack; and
    an insulation trench extending into the semiconductor substrate, wherein the insulation trench comprises an electrically conductive trench structure and at least an insulation layer in the semiconductor substrate and electrically insulating the conductive trench structure and the crack propagation prevention structure from the semiconductor substrate, wherein the crack propagation prevention structure extends vertically at least from a surface of the wiring layer stack to the conductive trench structure,
    wherein the crack propagation prevention structure is an electrically conductive structure configured to float during operating the semiconductor device with the conductive trench structure.

2. The semiconductor device according to claim 1, wherein the wiring layer stack is free from inorganic insulating solid material extending laterally along a straight line from outside a region laterally enclosed by the crack propagation prevention structure to the region laterally enclosed by the crack propagation prevention structure.

3. The semiconductor device according to claim 1, wherein the electrically conductive trench structure includes a gate silicon and the insulation layer includes a gate oxide surrounding the gate silicon of the electrically conductive trench structure and the crack propagation prevention structure not being electrically connected to a drain and configured to reduce dendrite formation at the crack propagation prevention structure.

4. The semiconductor device according to claim 3, wherein the electrically conductive trench structure comprises polysilicon.

5. The semiconductor device according to claim 1, further comprising a semiconductor package structure comprising a mold material, wherein the mold material is in contact with the crack propagation prevention structure.

6. The semiconductor device according to claim 5, wherein the mold material is continuously in contact with the crack propagation prevention structure along the edge region of the wiring layer stack.

7. The semiconductor device according to claim 1, wherein the crack propagation prevention structure is a vertical gap in the wiring layer stack.

8. The semiconductor device according to claim 7, wherein the vertical gap in the wiring layer stack is at least partially filled by mold material of a semiconductor package structure.

9. The semiconductor device according to claim 1, wherein a width of the insulation trench at a level of a front side surface of the semiconductor substrate is at least 10% larger than a width of the crack propagation prevention structure at the level of the front side surface of the semiconductor substrate.

10. The semiconductor device according to claim 1, wherein a width of the crack propagation prevention structure at a level of a front side surface of the semiconductor substrate is larger than 300 nm.

11. The semiconductor device according to claim 1, wherein the crack propagation prevention structure extends continuously to the insulation trench along the edge region of the wiring layer stack.

12. The semiconductor device according to claim 1, wherein the insulation trench includes a maximal depth that differs from a maximal depth of a gate trench of a transistor structure of the semiconductor device by less than 20% of the maximal depth of the gate trench.

13. The semiconductor device according to claim 1, wherein the surface of the wiring layer stack is an interface surface between one or more back end of line structures and air or a package material formed during packaging.

14. The semiconductor device according to claim 1, wherein the insulation trench laterally surrounds an active region of the semiconductor substrate.

15. The semiconductor device according to claim 1, wherein a portion of the crack propagation prevention structure is located at least in every lateral wiring layer of the wiring layer stack below a pad metallization layer of the wiring layer stack.

16. The semiconductor device according to claim 1, wherein all wiring structures comprised by the wiring layer stack and connected to the semiconductor substrate are located within a region laterally surrounded by the crack propagation prevention structure.

17. A method for forming a semiconductor device, the method comprising:
    forming an insulation trench extending from a surface of a semiconductor substrate of the semiconductor device into the semiconductor substrate, wherein the insulation trench comprises at least an insulation layer insulating a conductive trench structure from the semiconductor substrate, and
    forming a crack propagation prevention structure located at an edge region of a wiring layer stack, wherein the wiring layer stack is located on the front side surface of the semiconductor substrate, wherein the crack propagation prevention structure is formed to laterally surround at least one wiring structure located within the wiring layer stack, wherein the crack propagation prevention structure is formed to extend vertically at least from the surface of the wiring layer stack to the insulation trench, wherein the insulation layer of the insulation trench electrically insulates the crack propagation prevention structure from the semiconductor substrate while connecting to the conductive trench structure, and wherein the crack propagation prevention structure is an electrically conductive structure configured to float during operating the semiconductor device with the conductive trench structure.

18. A semiconductor device comprising:
- an electrically conductive crack propagation prevention structure located at an edge region of a wiring layer stack located on a semiconductor substrate of the semiconductor device, wherein the electrically conductive crack propagation prevention structure laterally surrounds at least one wiring structure located within the wiring layer stack; and
- an insulation trench extending into the semiconductor substrate, wherein the insulation trench comprises an electrically conductive trench structure and at least an insulation layer in the semiconductor substrate that separates the electrically conductive trench structure from the semiconductor substrate,
- wherein the electrically conductive trench structure and the electrically conductive crack propagation prevention structure are each electrically insulated from the semiconductor substrate.

* * * * *